United States Patent [19]

Suzuki

[11] Patent Number: 4,745,375
[45] Date of Patent: May 17, 1988

[54] VARIABLE FREQUENCY OSCILLATOR WITH CURRENT CONTROLLED REACTANCE CIRCUIT

[75] Inventor: Tsuneo Suzuki, Kamakura, Japan

[73] Assignee: Kabushiki Kaisha Toshiba, Kawasaki, Japan

[21] Appl. No.: 943,801

[22] Filed: Dec. 19, 1986

[30] Foreign Application Priority Data

Dec. 20, 1985 [JP] Japan ................... 60-286926

[51] Int. Cl.⁴ .............................. H03B 5/36
[52] U.S. Cl. ............................. 331/116 R; 331/177 R
[58] Field of Search ............ 331/116 R, 116 FE, 158, 331/177 R, 117 R; 332/26

[56] References Cited

U.S. PATENT DOCUMENTS

| | | | |
|---|---|---|---|
| 3,986,145 | 10/1976 | Hongu et al. | 331/116 R X |
| 4,581,593 | 4/1986 | Okanobu | 331/116 R |
| 4,587,500 | 5/1986 | Tanaka et al. | 333/213 |

OTHER PUBLICATIONS

Nikkei Electronics, pp. 141-163, Jan. 30, 1984.

*Primary Examiner*—Siegfried H. Grimm
*Attorney, Agent, or Firm*—Finnegan, Henderson, Farabow, Garrett & Dunner

[57] ABSTRACT

A variable frequency circuit for generating a frequency output variable in response to a control signal. The variable frequency circuit includes a ceramic resonator, an exciting amplifier for exciting an oscillation in the ceramic resonator, a first current supplying circuit for supplying a driving current to the exciting amplifier, a variable reactance circuit connected in parallel to the ceramic resonator, the variable reactance circuit operating as an equivalent reactance, a second current supplying circuit responsive to the control signal for supplying a variable driving current to the variable reactance circuit, and a coupling circuit for coupling the first current supplying circuit and the second current supplying circuit together for controlling the driving current of the first current supplying circuit in response to the variable driving current of the second current supplying circuit.

15 Claims, 3 Drawing Sheets

VARIABLE FREQUENCY OSCILLATOR WITH CURRENT CONTROLLED REACTANCE CIRCUIT

BACKGROUND OF THE INVENTION

1. Field of the Invention

The present invention relates to a variable frequency oscillator, and more particularly to a variable frequency oscillator with a solid resonator device such as a ceramic resonator.

2. Description of the Prior Art

In the prior art, there has been proposed a variable frequency oscillator employing a solid resonator device, such as a ceramic resonator device. For example, Japanese electronics magazine "Nikkei Electronics" issued Jan. 30, 1984 and published by Nikkei-McGraw-Hill, Inc., discloses such a variable frequency oscillator on pages 151 to 157. See, in particular, FIG. 9 of that magazine. An equivalent variable frequency oscillator is also disclosed in the U.S. Pat. No. 4,587,500.

These conventional variable frequency oscillators are comprised of a resonant circuit, an amplifier connected to the resonant circuit for exciting an oscillation of the resonant circuit, and a variable reactance circuit connected in parallel to the resonant circuit. The variable reactance circuit has two amplification circuits operating respectively as positive and negative equivalent reactances. The positive equivalent reactance is regarded as an inductance (referred as positive inductance hereafter) or a negative capacitance. While the negative equivalent reactance is regarded as a capacitance (referred as positive capacitance hereafter) or a negative inductance.

The variable reactance circuit operates as one element for defining a resonant frequency together with the resonant circuit. Control signals are applied to the amplification circuits so that the equivalent reactance seen from the resonant circuit is adapted to be varied from a negative given value to a positive given value. That is, the variable reactance circuit may vary between an inductive state and a capacitive state. Accordingly, the oscillation frequency of the variable frequency oscillator may vary in a relatively wide range in accordance with the control signals through the variation of the reactance of the resonant circuit.

A resonant circuit current, i.e., a current flowing through a resonant circuit has an imaginary component due to the reactance of the resonant circuit, as well as a real component. As is well known, the resonant circuit current must have a reasonable amount of real component for maintaining a stable oscillation. If the real component of the resonant circuit current becomes insufficient, an amplitude of the resonant circuit current decreases or the oscillation is interruppted. On the other hand, if the real component of the resonant circuit current becomes too large, the resonant circuit current is distorted in its waveform or a parastic oscillation occurs. Therefore, it is desired that the real component of the resonant circuit current be maintained constant within the variable range of the oscillation frequency.

In the conventional variable frequency oscillator, however, a real component of a resonant circuit current flowing through the resonant circuit varies with the variation of the oscillation frequency. This is so since the resonant circuit current is a resultant vector of both an exciting amplifier current and a variable reactance circuit current, i.e., currents flowing through the exciting amplifier and the variable reactance circuit and applied to the resonant circuit therefrom. The variable reactance circuit current varies in accordance with the control signals. The real component of the resonant circuit current becomes too small when the reactance of the variable reactance circuit reaches a large positive capacitance or achieves a highly capacitive state. On the other hand, the real component of the resonant circuit current becomes too large when the reactance of the variable reactance circuit reaches a large negative capacitance or achieves a highly inductive state.

As a result, the conventional variable frequency circuit readily fails to maintain the oscillation in the former case. Or the conventional variable frequency circuit causes the undesired parasitic oscillation in the latter case.

The problems of the oscillation stoppage or the parasitic oscillation tend to occur because the variable frequency circuit is operated under a relatively low power supply voltage.

SUMMARY OF THE INVENTION

Accordingly, an object of the present invention is to provide a variable frequency circuit which is able to oscillate stably in a relatively wide frequency range.

Another object of the present invention is to provide a variable frequency circuit in which oscillation is unlikely to stop.

A further object of the present invention is to provide a variable frequency circuit which is unlikely to cause parasitic oscillation.

A still further object of the present invention is to provide a variable frequency circuit which is able to oscillate stably under a relatively low power supply voltage.

In order to achieve the above objects, the variable frequency circuit for generating a frequency output variable in response to a control signal includes a ceramic resonator, an exciting amplifier for exciting an oscillation in the ceramic resonator, a first current supplying circuit for supplying a driving current to the exciting amplifier, a variable reactance circuit connected in parallel to the ceramic resonator, the variable reactance circuit operating as an equivalent reactance, a second current supplying circuit responsive to the control signal for supplying a variable driving current to the variable reactance circuit, and a coupling circuit for coupling the first current supplying circuit and the second current supplying circuit together for controlling the driving current of the first current supplying circuit in response to the variable driving current of the second current supplying circuit.

DESCRIPTION OF THE PREFERRED EMBODIMENT

The present invention will be described in detail with reference to the accompanying drawings, namely, FIG. 1 through FIG. 5.

Figure 1:
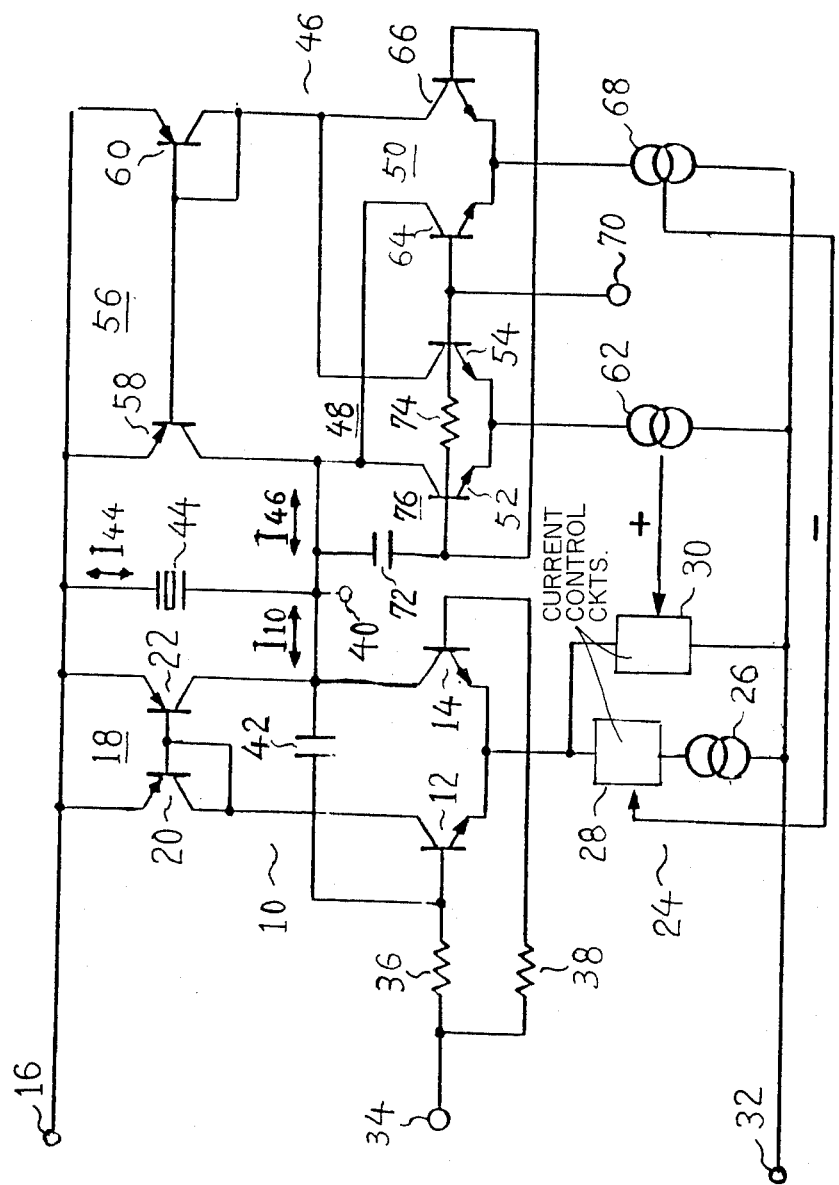
FIG. 1 is a circuit diagram showing an embodiment of the variable frequency circuit according to the present invention.

In FIG. 1, an exciting amplifier 10 is a differential amplifier which is comprised of a differential pair of NPN transistors 12, 14. Transistors 12, 14 are connected at their collectors to a positive power supply terminal 16 through a first active load 18. First active load 18 is a current mirror circuit which is comprised of PNP transistors 20, 22 as described later. The common-connected emitters of NPN transistors 12, 14 are connected to a first current source circuit 24 which is comprised of a constant current source 26, a first current control circuit 28, a second current control circuit 30. Constant current source 26 and first current control circuit 28 are connected in series between the common-connected emitters of transistors 12, 14 and a negative power supply terminal 32. Second current control circuit 30 is connected between the common-connected emitters of transistors 12, 14 and negative power supply terminal 32 in parallel with the series circuit of constant current source 26 and first current control circuit 28. First current control circuit 28 and second current control circuit 30 will be described in detail later.

The bases of transistors 12, 14 are connected to a first base bias supply terminal 34 through resistors 36, 38. The collector of transistor 14 is connected to an output terminal 40 and also connected to the base of transistor 12 through a positive feedback capacitor 42 for a positive signal feedback.

In first active load 18, the bases of transistors 20, 22 are connected together, while transistor 20 is connected in a diode fashion, having its base connected to its collector. A solid resonator device, such as a ceramic resonator 44, is connected to output terminal 40 and in parallel to first active load 18.

To output terminal 40, a variable reactance circuit 46 is further connected. Variable reactance circuit 46 is comprised of a first equivalent reactance circuit 48 which operates as a positive equivalent reactance, and a second equivalent reactance circuit 50 operates as a negative equivalent reactance. First equivalent reactance circuit 48 is a differential amplifier which is comprised of a differential pair of NPN transistors 52, 54. Transistors 52, 54 are connected at their collectors to positive power supply terminal 16 through a second active load 56. Second active load 56 is a current mirror circuit which is comprised of PNP transistors 58, 60. The bases of transistors 58, 60 are connected to each other, while transistor 60 is connected in diode fashion, having its base connected to its collector. The common-connected emitters of transistors 52, 54 are connected to negative power supply terminal 32 through a second current source circuit 62. Second current source circuit 62 is connected to second current control circuit 30 of first current source circuit 24 as described later.

Second equivalent reactance circuit 50 is a differential amplifier which is comprised of a differential pair of NPN transistors 64, 66. Transistors 64, 66 are connected at their collectors to positive power supply terminal 16 through second active load 56 in a similar manner to transistors 52, 54. The common-connected emitters of transistors 64, 66 are connected to negative power supply terminal 32 through a third current source circuit 68. Third current source circuit 68 is connected to first current control circuit 28 of first current source circuit 24 as described later. The bases of transistors 56, 64 are commonly connected to a second base bias supply terminal 70. While the bases of transistor 52, 66 are commonly connected to output terminal 40 through a phase shift capacitor 72. Further a phase shift resistor 74, which constitutes a phase shift circuit 76 together with phase shift capacitor 72, is connected between the bases of transistors 52, 54.

Figure 2:
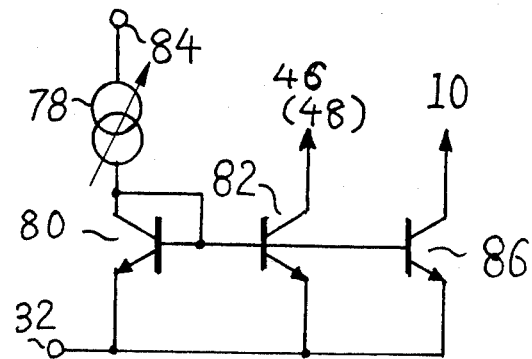
FIG. 2 is a circuit diagram showing a current source circuit suitable to the variable frequency circuit of FIG. 1.

Referring now to FIG. 2, second current source circuit 62, second current control circuit 30 of first current source circuit 24 and a circuit connection therebetween will be described in detail. Second current source circuit 62 is comprised of a first variable current source 78 and a current mirror circuit which is comprised of NPN transistors 80, 82. The first variable current source 78 is controlled by a control signal applied from a control signal source (not shown). The bases of transistors 80, 82 are connected to each other and transistor 80 is connected in the diode fashion, having its base connected to its connector. First variable current source 78 and transistor 80 are connected in series between a constant potential supply terminal 84 and negative power supply terminal 32, while transistor 82 is connected between the common-connected emitters of transistors 52, 54 of first equivalent reactance circuit 48 and negative power supply terminal 32. Second current control circuit 30 is constituted by an NPN transistor 86 which has a base connected to the bases of transistors 80, 82 in common. As a result, transistor 86 also constitutes a current mirror circuit together with transistor 80.

Figure 3:
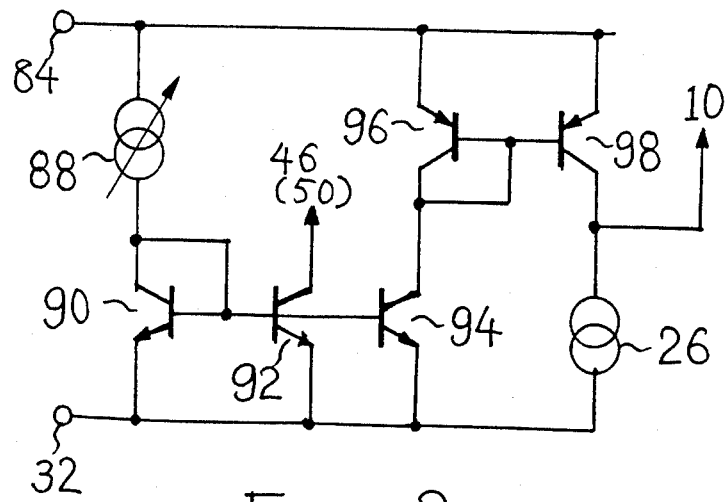
FIG. 3 is a circuit diagram showing another current source circuit suitable to the variable frequency circuit of FIG. 1.

Referring now to FIG. 3, third current source circuit 68, first current control circuit 28 of first current source circuit 24 and a circuit connection therebetween will be described in detail. Third current source circuit 68 is comprised of a second variable current source 88 and a current mirror circuit which is comprised of NPN transistors 90, 92. The second variable current source 88 is controlled by the control signal applied from a control signal source (not shown). The control signal selectably operates the first and second variable current sources 78 and 88. The bases of transistors 90, 92 are connected to each other and transistor 90 is connected in diode fashion, having its base connected to its collector. Second variable current source 88 and transistor 90 are connected in series between constant potential supply terminal 84 and negative power supply terminal 32, while transistor 92 is connected between the common-connected emitters of transistors 64, 66 of second equivalent reactance circuit 50 and negative power supply terminal 32. First current control circuit 28 is constituted by an NPN transistor 94 and a current mirror circuit which is comprised of PNP transistors 96, 98. The bases of transistors 96, 98 are connected to each other and transistor 96 is connected in diode fashion, having its base connected to its collector. Transistor 96 is connected between constant potential supply terminal 84 and negative power supply terminal 32 through transistor 94, while transistor 98 is connected between constant potential supply terminal 84 and negative power supply terminal 32 through constant current source 26 of first current source circuit 24. Transistor 94 has a base connected to the bases of transistors 90, 92 in common. As a result, transistor 94 also constitutes a current mirror circuit together with transistor 90. The connection node of transistor 98 and constant current source 26 is connected to the common-connected emitters of transistors 12, 14 of exciting amplifier 10.

Now the operation of the above embodiment will be described hereafter. First equivalent reactance circuit 48 and second equivalent reactance circuit 50 of variable reactance circuit 46, respectively, operate as the equivalent reactances similar to a conventional circuit. The admittance Y of variable reactance circuit 46 is given as follows;

$$Y = \frac{1 + gm \cdot R74}{R74 + \frac{1}{j\omega \cdot C72}} = \qquad (1)$$

$$\frac{1}{R74 \cdot \left[1 + \left(\frac{1}{\omega \cdot C72 \cdot R74}\right)^2\right]} + \frac{1}{1 + gm \cdot R74}$$

$$\frac{1}{\frac{1 + (\omega \cdot C72 \cdot R74)^2}{j\omega \cdot (1 + gm \cdot R74) \cdot C72}}$$

where gm is a mutual conductance, R74 is the resistance of phase shift resistor 74, C72 is a capacitance of phase shift capacitor 72, and ω(omega) is an angle frequency of the oscillation signal.

If $R74 \ll 1/(\omega \cdot C72)$, equivalent capacitance C46 of variable reactance circuit 46 is obtained as follows;

$$C46 = (1 + gm \cdot R74)C72 \qquad (2)$$

In above equations (1) and (2), mutal conductance gm is given as follows;

$$gm = q \cdot I/(2 \cdot k \cdot T) \qquad (3)$$

where q is the electron charge, I is the current of second current source circuit 62 or third current source circuit 68, k is the Boltzman's constant, and T is an absolute temperature.

From equations (2) and (3), it is understood that equivalent capacitance C46 varies in response to the variation of current I.

Figure 4:
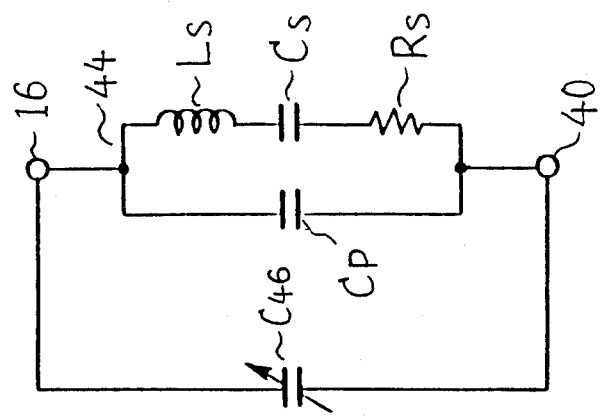
FIG. 4 is an equivalent circuit of the resonant circuit according to the variable frequency circuit of FIG. 1.

Equivalent capacitance C46 is substantially connected in parallel to ceramic resonator 44, as seen from the circuit connection shown in FIG. 1. Here, assume that ceramic resonator 44 has an equivalent circuit as shown in FIG. 4. That is, ceramic resonator 44 is comprised of a series equivalent inductance Ls, a series equivalent capacitance Cs, a series equivalent resistance Rs, and a parallel equivalent capacitance Cp. Then equivalent variable capacitance C46 is further connected in parallel to parallel equivalent capacitance Cp. The resonant circuit comprised of ceramic resonator 44 and variable reactance circuit 46 has an impedance Z as follows;

$$Z = \frac{\frac{1}{j\omega \cdot C}\left(j\omega \cdot Ls + \frac{1}{j\omega \cdot Cs} + Rs\right)}{j\omega \cdot \frac{C \cdot Cs}{C + Cs} + j\omega \cdot Ls + Rs} \qquad (4)$$

where C is a parallel resultant capacitance of equivalent variable capacitance C46 and parallel equivalent capacitance Cp, i.e., $C = C46 + Cp$.

A resonant angle frequency ωr of the equivalent circuit shown in FIG. 4 is given as follows;

$$\omega r = \sqrt{\frac{C + Cs}{C \cdot Cs \cdot Ls}} \qquad (5)$$

In the resonant condition at the resonant angle frequency ωr, the resonant circuit has a resonant impedance Zr as given as follows;

$$Zr = \frac{1}{Rs} \cdot \frac{Cs \cdot Ls}{C \cdot (C + Cs)} - j\sqrt{\frac{Cs \cdot Ls}{C \cdot (C + Cs)}} \qquad (6)$$

In equation (6), the second term is sufficiently small in comparison to the first term. Equation (6) then is approximated as follows;

$$Zr = \frac{1}{Rs} \cdot \frac{Cs \cdot Ls}{C \cdot (C + Cs)} \qquad (7)$$

Resonant impedance Zr obtained as equation (7) can be presumed to be a resistance component of the resonant circuit at the resonant condition. It is understood that resonant impedance Zr varies inversely to a variation of parallel resultant capacitance C. That is, resonant impedance Zr decreases when parallel resultant capacitance C increases. The variation of parallel resultant capacitance C is caused by variable equivalent capacitance C46.

The amplitude of the oscillation frequency output of the variable oscillation circuit on output terminal 40 is effected by resonant impedance Zr. Thus, the amplitude of the oscillation frequency output on output terminal 40 varies in accordance with the variation of variable equivalent capacitance C46 of variable reactance circuit 46. Variable equivalent capacitance C46 is controlled by a current I62 which flows through second current source circuit 62 or a current I68 which flows through third current source circuit 68 for controlling the resonant oscillation frequency. When currents I62 and I68 are both zero, i.e., $I62 = I68 = 0$, the resonant circuit shown in FIG. 4 oscillates at a center frequency fc which is determined only by ceramic resonator 44.

When only current I62 flows in variable reactance circuit 46 (i.e., current I68 is zero), variable reactance circuit 46 becomes capacitive as described before. As a result, the amplitude of the oscillation frequency output on output terminal 40 tends to decrease according to the decrease of resonant impedance Zr. However, a current I30 flows through second current control circuit 30 in response to current I62 at that time. This is so since transistor 86 in second current control circuit 30 is coupled to second current source circuit 62 by the current mirror circuit connection as shown in FIG. 2. Current I30 is added to a current I26 of constant current source 26 in exciting amplifier 10. This is so since transistor 86 of second current control circuit 30 is connected in parallel with transistor 82 of constant current source 26. Therefore, current I30 operates to more excite exciting amplifier 10 so that the amplitude of the oscillation frequency output is compensated to a suitable level. When the emitter area ratio between transistors 82, 86 is suitably selected, the amplitude of the oscillation frequency output can be maintained at a given value.

Figure 5:
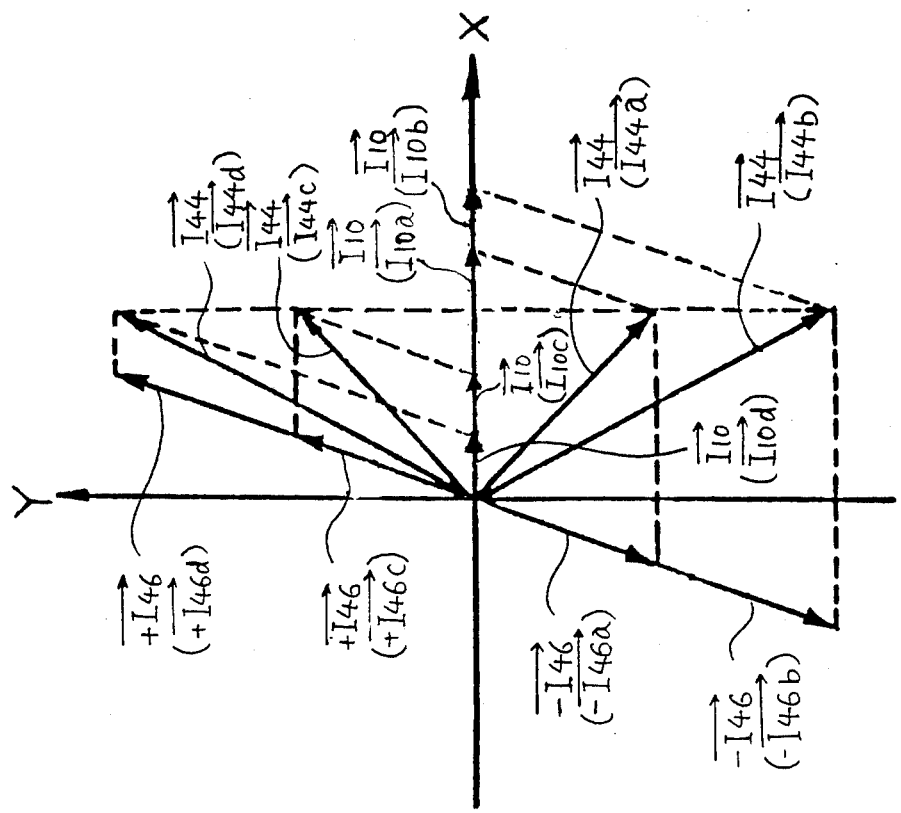
FIG. 5 is a graph for explaining currents flowing in the variable frequency circuit shown in FIG. 1 in vector forms on X-Y coordinates.

Referring now to FIG. 5 which shows currents flowing in the variable frequency circuit shown in FIG. 1 in vector forms on X-Y coordinates, the above operation will be explained in more detail. In FIG. 5, a current I46 which flows into ceramic resonator 44 from variable reactance circuit 46 presents as current vector $-\vec{I46}$ on the third quadrant. A current I10 which flows into ceramic resonator 44 from exciting amplifier 10 presents a current vector $\vec{I10}$ on the positive X axis on which the real components are taken. Then, a current I44, which is the oscillation current outputted from output terminal 40, presents a resultant current vector $\vec{I44}$ on the fourth quadrant. When current vector $-\vec{I46}$ varies as shown, e.g., by $-\vec{I46a}$ and $-\vec{I46b}$ according to the variation of I62, current vector $\vec{I10}$ also varies as shown by I10a and I10b. Then, resultant current vector $\vec{I44}$ varies as shown by $\vec{I44a}$ and $\vec{I44b}$. However, X axis components I44ax and I44bx of resultant current vector $\vec{I44a}$ and $\vec{I44a}$ are always maintained constant during the variation. This means that the oscillation output on output terminal 40 is always kept at a constant amplitude in spite of the variation of resonant impedance Zr at that time.

When only current I68 flows in variable reactance circuit 46 (i.e., current I62 is zero), variable reactance circuit 46 becomes inductive or negative capacitive as described before. As a result, the amplitude of the oscillation frequency output on output terminal 40 tends to increases according to the increase of resonant impedance Zr. However, a current I28 flows through first current control circuit 28 in response to current I68 at that time. This is so since transistor 94 in first current control circuit 28 is coupled to third current source circuit 68 by the current mirror circuit connection as shown in FIG. 3. Current I28 is subtracted from I26 of constant current source 26 in exciting amplifier 10 since the current path of transistor 94 in first current control circuit 28 is connected in series with constant current source 26. Therefore, current I28 operates to less excite exciting amplifier 10 so that the amplitude of the oscillation frequency output is compensated to the suitable level. When the emitter area ratio between transistors 92, 94 is suitably selected, the amplitude of the oscillation frequency output can be maintained constant.

Referring now again to FIG. 5, the above operation will be explained in more detail. In FIG. 5, current I46 flowing into ceramic resonator 44 from variable reactance circuit 46 presents a current vector $+\vec{I46}$ on the first quadrant. Current I10 flowing into ceramic resonator 44 from exciting amplifier 10 presents a current vector $\vec{I10}$ also on the positive X axis. Then, current I44, which is the oscillation current, presents a resultant current vector $\vec{I44}$ on the first quadrant. When current vector $+\vec{I46}$ varies as shown, e.g., by $+\vec{I46c}$ and $+\vec{I46d}$ according to the variation of current I62, current vector $\vec{I10}$ also varies as shown by $\vec{I10c}$ and $\vec{I10d}$. Then, resultant current vector $\vec{I44}$ varies as shown by $\vec{I44c}$ and $\vec{I44d}$. However, X axis components I44cx and I44dx of resultant current vectors $\vec{I44c}$ and $\vec{I44d}$ are always maintained constant during the variation similar to the former case. This means that the oscillation output on output terminal 40 is always kept at a constant amplitude in spite of the variation of resonant impedance Zr at that time.

According to the above embodiment, the variable frequency circuit of the present invention is able to generate a stable oscillation signal with a relatively constant amplitude. Thus, problems with the oscillation stopping or with parasitic oscillation are avoided. Further, the frequency range of the variable frequency can be widened. And further the variable frequency circuit can operate at a relatively low power supply voltage.

Although the present invention has fully been described in connection with the preferred embodiment thereof with reference to the accompanying drawings, it is to be noted that various changes and modifications are apparent to those skilled in the art. Such changes and modifications are to be understood as included within the scope of this invention as claimed.

What is claimed is:

1. A variable frequency circuit for generating a frequency output variable in response to a control signal comprising:
    a solid resonator means;
    an exciting amplifier for exciting an oscillation in the solid resonator means;
    a first current supplying means for supplying a driving current to the exciting amplifier;
    a variable reactance circuit connected in parallel to the solid resonator means, the variable reactance circuit operating as an equivalent reactance;
    a second circuit supplying means responsive to the control signal for supplying a variable driving current to the variable reactance circuit; and
    means for coupling the first current supplying means and the second current supplying means for controlling the driving current of the first current supplying means in response to the variable driving current of the second current supplying means.

2. The variable frequency circuit of claim 1, wherein the solid resonator means is a ceramic resonator.

3. The variable frequency circuit of claim 2, wherein the first current supplying means includes means for supplying a constant current to the exciting amplifier and means for supplying a compensating current to the exciting amplifier in response to the variable driving current of the second current supplying means.

4. The variable frequency circuit of claim 3, wherein the compensating current supplying means is connected in parallel to the constant current supplying means.

5. The variable frequency circuit of claim 4, wherein the second current supplying means includes a variable current source and a first transistor connected as a diode and connected in series with the variable current source, the compensating current supplying means includes a second transistor, and the coupling means is a common-base connection for coupling the first and second transistors together in a current mirror circuit configuration.

6. The variable frequency circuit of claim 5, wherein the second current supplying means further includes a third transistor having a base connected to the bases of the first and second transistors and a collector connected to the variable reactance circuit.

7. The variable frequency circuit of claim 3, wherein the compensating current supplying means is connected in series with the constant current supplying means.

8. The variable frequency circuit of claim 7, wherein the second current supplying means includes a variable current source and a first transistor connected as a diode and connected in series with the variable current source, the compensating current supplying means includes a second transistor and a current mirror circuit connected between the second transistor and the constant current supplying means, and the coupling means is a common-base connection for coupling the first and second transistors in a current mirror circuit configuration.

9. The variable frequency circuit of claim 8, wherein the second current supplying means further includes a third transistor having a base connected to the bases of the first and second transistors and a collector connected to the variable reactance circuit.

10. The variable frequency circuit of claim 2, wherein the variable reactance circuit includes a first amplifier circuit for operating as a positive equivalent reactance and a second amplifier circuit for operating as a negative equivalent reactance, the first and second amplifier circuits being connected in parallel to each other and to the ceramic resonator.

11. The variable frequency circuit of claim 10, wherein the second current supplying means includes a first variable driving current source circuit connected to the first amplifier circuit for supplying a first variable driving current and a second variable driving current source circuit connected to the second amplifier circuit for supplying a second variable driving current, and the first current supplying means includes means for supplying a constant current to the exciting amplifier, means for supplying a first compensating current to the exciting amplifier in response to the first variable driving current of the first variable driving current source circuit and means for supplying a second compensating current to the exciting amplifier in response to the second variable driving current of the second variable driving current source circuit.

12. The variable frequency circuit of claim 11 further comprising means for selectably operating the first and second variable driving current source circuits.

13. The variable frequency circuit of claim 12, wherein the first compensating current supplying means is connected in parallel to the constant current supplying means and the second compensating current supplying means is connected in series to the constant current supplying means.

14. The variable frequency circuit of claim 13, wherein the first variable driving current source circuit includes a first variable current source and a first transistor connected as a diode and connected in series with the first variable current source, the second variable driving current source circuit includes a second variable current source and a second transistor connected as a diode and connected in series with the second variable current source, the first compensating current supplying means includes a third transistor, the second compensating current supplying means includes a fourth transistor and a current mirror circuit connected between the fourth transistor and the constant current supplying means, and the coupling means includes a first common-base connection for coupling the first and third transistors together in a current mirror circuit configuration and a second common-base connection for coupling the second and fourth transistors together in the current mirror circuit configuration.

15. The variable frequency circuit of claim 14, wherein the second current supplying means further includes a fifth transistor having a base connected to the bases of the first and third transistors and a collector connected to the first amplifier circuit and a sixth transistor having a base connected to the bases of the second and fourth transistors and a collector connected to the second amplifier circuit.

* * * * *